United States Patent
Segawa

(10) Patent No.: US 6,825,722 B2
(45) Date of Patent: Nov. 30, 2004

(54) MIXER AND DIFFERENTIAL AMPLIFIER HAVING BANDPASS FREQUENCY SELECTIVITY

(75) Inventor: Yuichi Segawa, Chiba (JP)

(73) Assignee: Kawasaki Microelectronics, Inc., Chiba (JP)

(*) Notice: Subject to any disclaimer, the term of this patent is extended or adjusted under 35 U.S.C. 154(b) by 0 days.

(21) Appl. No.: 10/392,877

(22) Filed: Mar. 21, 2003

(65) Prior Publication Data

US 2003/0184378 A1 Oct. 2, 2003

(30) Foreign Application Priority Data

Mar. 29, 2002 (JP) ........................................ 2002-095771

(51) Int. Cl.[7] ................................................ H03F 3/45
(52) U.S. Cl. ........................................ 330/254; 330/253
(58) Field of Search ................................ 330/254, 253; 333/213, 214, 215, 216, 217; 327/359

(56) References Cited

U.S. PATENT DOCUMENTS

| | | | | |
|---|---|---|---|---|
| 3,624,514 A | * | 11/1971 | Putzer | ................... 455/180.4 |
| 5,682,122 A | * | 10/1997 | Toumazou et al. | .......... 330/308 |
| 6,028,496 A | * | 2/2000 | Ko et al. | .................... 333/214 |
| 2002/0028660 A1 | * | 3/2002 | Desclos | ....................... 455/73 |

* cited by examiner

*Primary Examiner*—Henry Choe
(74) *Attorney, Agent, or Firm*—Oliff & Berridge, PLC

(57) ABSTRACT

A mixer and a differential amplifier are formed using simple circuit configurations such that the cutoff frequencies thereof can be easily changed. Each of the mixer and the differential amplifier includes an NMOS transistor to which an RF signal is input, NMOS transistors to which an LO− signal and an LO+ signal are respectively input from a local oscillator, and two parallel resonant circuits each serving as an output load and including an active inductor, a capacitor, and a resistor.

9 Claims, 11 Drawing Sheets

$$f1 = \frac{1}{2\pi\sqrt{LC}} - \frac{R}{2}\sqrt{\frac{C}{L}}$$

$$f2 = \frac{1}{2\pi\sqrt{LC}} + \frac{R}{2}\sqrt{\frac{C}{L}}$$

MIXER AND DIFFERENTIAL AMPLIFIER HAVING BANDPASS FREQUENCY SELECTIVITY

BACKGROUND OF THE INVENTION

1. Field of Invention

The present invention relates to a mixer for mixing an AC signal with a reference signal having a particular frequency, and also to a differential amplifier for amplifying the difference between two signals and outputting a resultant amplified differential signal.

2. Description of Related Art

In an RF (Radio Frequency) receiving circuit, a received RF signal is mixed by a mixer with an LO (Local Oscillator) signal and the RF signal is down-converted into an IF (Intermediate Frequency) signal.

FIG. 7 illustrates a mixer in an RF receiving circuit.

FIG. 8 illustrates an exemplary process in which the mixer shown in FIG. 7 down-converts an RF signal into an IF signal.

FIG. 7 illustrates an RF signal serving as a carrier signal and an LO signal supplied from a local oscillator (not shown) applied to the mixer 101. The mixer 101 mixes the RF signal and the LO signal and outputs an IF signal as shown in FIG. 8. Thus, the RF signal is down-converted into the IF signal.

When it is required to remove undesirable signal components in frequency bands other than the IF frequency band from the IF signal obtained via the down conversion, a bandpass filter is generally positioned at a stage following the mixer. FIG. 9 illustrates a mixer and a bandpass filter. FIG. 10 illustrates an exemplary process in which undesirable signal components are removed from an IF signal by the bandpass filter.

As shown in FIG. 10, when there are signals A1 and B1 at both sides of an RF signal, the RF signal including the signals A1 and B1 and the LO signal are applied to the mixer 101 shown in FIG. 9. As a result, in addition to the IF signal, signals A2 and B2 are output from the mixer 101. If signals A2 and B2 are passed through the bandpass filter, the signals A2 and B2 are attenuated into signals A3 and B3. Thus, their influence on the IF signal is reduced.

FIG. 11 illustrates a circuit configuration of the bandpass filter shown in FIG. 9. FIG. 12 illustrates the frequency characteristic of the bandpass filter shown in FIG. 11.

As shown in FIG. 11, the bandpass filter 102 is formed of passive elements including capacitors 102_1 and 102_4 and resistors 102_2 and 102_3. As shown in FIG. 12, the bandpass filter 102 has cutoff frequencies f1 and f2 determined by the values of the passive elements. When the capacitors 102_1 and 102_4 have capacitance C1 and C2, and the resistors 102_2 and 102_3 have resistance R1 and R2, the cutoff frequency f1 is given by the equation:

$$f1 = \frac{1}{2\pi\sqrt{C1 \cdot R1}} \quad (1)$$

and the cutoff frequency f2 is given by the equation:

$$f2 = \frac{1}{2\pi\sqrt{C2 \cdot R2}} \quad (2)$$

The bandpass filter 102 passes frequency components within a particular band determined by the cutoff frequencies f1 and f2.

FIG. 13 illustrates a circuit configuration of a bandpass filter, configured differently from the bandpass filter shown in FIG. 11. FIG. 14 illustrates the frequency characteristic of the bandpass filter shown in FIG. 13.

The bandpass filter 103 shown in FIG. 13 is an active bandpass filter including capacitors 103_1 and 103_4, resistors 103_2 and 103_3, and an operational amplifier 103_5. As with the bandpass filter 102 shown in FIG. 11, the bandpass filter 103 also has cutoff frequencies f3 and f4 determined by values of the passive elements, and the bandpass filter 103 passes frequency components within a particular band determined by the cutoff frequencies f3 and f4.

FIG. 15 illustrates a biquad bandpass filter. FIG. 16 illustrates a circuit configuration of a transconductor amplifier used in the biquad bandpass filter.

The biquad bandpass filter 104 shown in FIG. 15 is a bandpass filter using the Gm-C technology comprising transconductor amplifiers (OTAs: Operational Transconductance Amplifiers) 104_1, 104_2, and 104_3, capacitors 104_4, 104_5, 104_6, and 104_7, and a resistor 104_8. The capacitors 104_4, 104_5, 104_6, and 104_7 all have equal capacitance C, and the resistor 104_8 has resistance R.

The transconductor amplifier 104_1 includes, as shown in FIG. 16, NMOS transistors 104_11, 104_12, 104_13, 104_14, 104_15, 104_16, 104_17, 104_18, and 104_19, constant current sources 104_20, 104_21, 104_22, 104_23, and resistors 104_24 and 104_25. Signals IN+ and IN−, which are different in phase by 180° from each other, are applied to the NMOS transistors 104_11 and 104_12, respectively. An external voltage signal Vf is applied to the NMOS transistor 14_19. The transconductance gm of the transconductor amplifier 104_1 varies depending on the value of the external voltage signal Vf applied to the NMOS transistors 104_19. The transconductance gm is given by the equation:

$$gm = \beta(Vf - Vs - Vt)$$

wherein β is the feedback factor of the NMOS transistor 104_19, Vs is equal to Vs2 (when Vs1>Vs2) or Vs1 (when Vs1<Vs2) (Vs1 and Vs2 are source and drain voltages, respectively, of the NMOS transistor 104_19), and Vt is the threshold voltage of the NMOS transistor 104_19.

Although the circuit configuration has been described above only for the transconductor amplifier 104_1, the transconductor amplifiers 104_2 and 104_3 also have a similar circuit configuration.

FIG. 17 illustrates the frequency characteristic of the biquad bandpass filter shown in FIG. 15.

The frequency characteristic of this biquad bandpass filter 15 shown in FIG. 17 is variable. More specifically, the cutoff frequencies f01 and f02 can be varied by varying the external voltage signal Vf thereby varying the transconductance gm of the transconductor amplifiers 104_1, 104_2, and 104_3. For example, when the external voltage signal Vf applied to the transconductor amplifier 104_2 is varied, the center frequency f0 shown in FIG. 17 is given by the equation:

$$f0 = gm2/2\pi C$$

where gm2 is the transconductance of the transconductor amplifier 104_2.

On the other hand, the difference between the cutoff frequency f01 and the cutoff frequency f02 is given by the equation:

$$\Delta f = gm2 \times R.$$

In the bandpass filters 102 and 103 shown in FIGS. 11 and 13, respectively, their cutoff frequencies are determined by the values of passive elements. This means that, to change the cutoff frequencies, the passive elements themselves must be changed. To change the values of passive elements formed on a semiconductor chip using CMOS technology or the like, it is required to change the layout of the passive elements of the semiconductor chip. The change in the layout needs a long time and high cost and thus the change results in great disadvantages in production or development. Another problem is that passive elements occupy large areas on the semiconductor chip.

Although the biquad bandpass filter 104 shown in FIG. 15 has the advantage that the cutoff frequencies can be controlled by the external voltage signal, the biquad bandpass filter 104 has the disadvantage that the circuit configuration of the transconductor amplifiers 104_1, 104_2, and 104_3 is complicated, needs a large number of transistors, and then needs a large-scale circuit.

SUMMARY OF THE INVENTION

In view of the above, it is an object of the present invention to provide a mixer and a differential amplifier which have simple circuit configurations and which allow the cutoff frequency to be easily changed.

According to an aspect of the present invention, a mixer is provided for mixing an AC signal with a reference signal having a particular frequency, wherein the mixer includes a parallel resonant circuit including an active inductor and serving as an output load.

Preferably, the AC signal is an RF signal and the reference signal is an output signal of a local oscillator, the frequency of the output signal being different by a particular value from the frequency of the RF signal.

Preferably, the active inductor includes two transconductance circuits and a capacitor such that the inductance of the active inductor is set by the transconductance of the two transconductance circuits and the capacitance of the capacitor.

Preferably, the inductance of the active inductor can be arbitrarily varied by controlling the transconductance of the two transconductance circuits in response to an external signal.

Preferably, the parallel resonant circuit comprises an active inductor, a capacitor, and a resistor that are connected in parallel.

Preferably, the parallel resonant circuit has bandpass frequency selectivity given by the expression:

$$\frac{1}{2\pi\sqrt{LC}} + \frac{R}{2} \cdot \sqrt{\frac{C}{L}} \geq f \geq \frac{1}{2\pi\sqrt{LC}} - \frac{R}{2} \cdot \sqrt{\frac{C}{L}}$$

where L is the inductance of the active inductor, C is the capacitance of the capacitor, R is the resistance of the resistor, and f is the resonant frequency of the parallel resonant circuit.

According to another aspect of the present invention, there is provided a differential amplifier for amplifying the difference between two input signals and outputting a resultant amplified differential signal, wherein the differential amplifier includes a parallel resonant circuit including an active inductor and serving as an output load.

Preferably, the active inductor includes two transconductance circuits and a capacitor such that the inductance of the active inductor is set by the transconductance of the two transconductance circuits and the capacitance of the capacitor.

Preferably, the inductance of the active inductor can be arbitrarily varied by controlling the transconductance of the two transconductance circuits in response to an external signal.

Preferably, the parallel resonant circuit includes an active inductor, a capacitor, and a resistor that are connected in parallel.

Preferably, the parallel resonant circuit has bandpass frequency selectivity given by the expression:

$$\frac{1}{2\pi\sqrt{LC}} + \frac{R}{2} \cdot \sqrt{\frac{C}{L}} \geq f \geq \frac{1}{2\pi\sqrt{LC}} - \frac{R}{2} \cdot \sqrt{\frac{C}{L}}$$

where L is the inductance of the active inductor, C is the capacitance of the capacitor, R is the resistance of the resistor, and f is the resonant frequency of the parallel resonant circuit.

As described above, each of the mixer and the differential amplifier according to the present invention has a resonant circuit including an active inductor and serving as an output load. The active inductor includes a transconductance circuit, which is constructed in a simple form as will be described later with reference to specific embodiments. The inductance L of the active inductor can be arbitrarily varied by controlling the transconductance of the transconductance circuit in response to an external signal, thereby easily varying the cutoff frequencies of the bandpass frequency selectivity. Each of the mixer and the differential amplifier can be formed on a semiconductor chip with a smaller size than is needed for a conventional bandpass filter using passive elements.

DETAILED DESCRIPTION OF PREFERRED EMBODIMENTS

The present invention is described in further detail below with reference to preferred embodiments.

Figure 1:
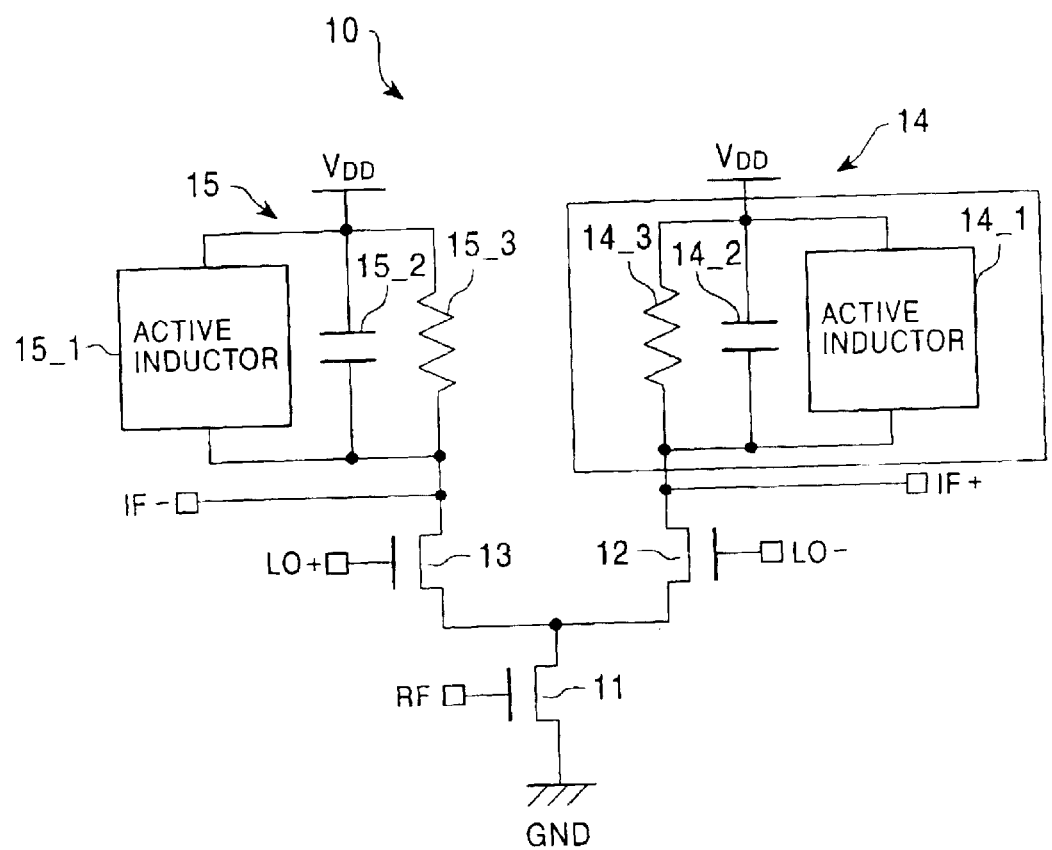
FIG. 1 is a circuit diagram of a mixer according to an embodiment of the present invention.

FIG. 1 is a circuit diagram of a mixer according to an embodiment of the present invention.

The mixer 10 shown in FIG. 1 is a single-balanced mixer formed on a semiconductor chip using CMOS technology or the like. The mixer 10 includes an NMOS transistor 11 to which an RF signal is input, an NMOS transistor 12 to which an LO− signal is input from a local oscillator, and an NMOS transistor 13 to which an LO+ signal different in phase by 180° from the LO− signal is input.

In the mixer 10, a parallel resonant circuit 14 serving as an output load of the mixer 10 is disposed between a power supply $V_{DD}$ and the NMOS transistor 12, and a parallel resonant circuit 15 serving as an output load is disposed between the power supply $V_{DD}$ and the NMOS transistor 13.

The parallel resonant circuit 14 includes an active inductor 14_1, a capacitor 14_2, and a resistor 14_3. The parallel resonant circuit 15 is configured in a similar manner as the parallel resonant circuit 14 and includes an active inductor 15_1, a capacitor 15_2, and a resistor 15_3.

Figure 2:
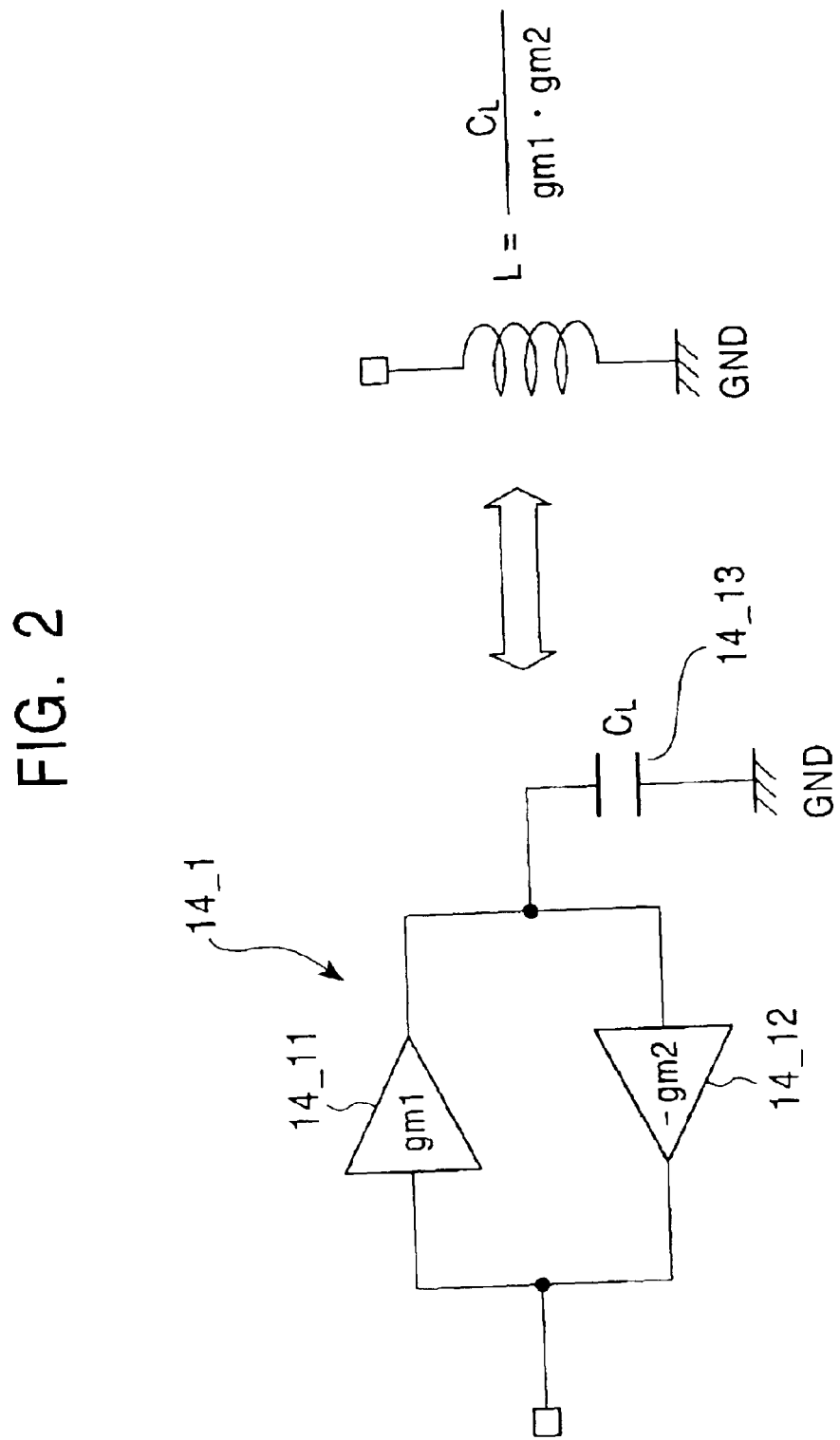
FIG. 2 is a diagram showing an equivalent circuit of an active inductor used in the mixer shown in FIG. 1.

FIG. 2 is a diagram showing an equivalent circuit of the active inductor 14-1 used in the mixer 10 shown in FIG. 1.

Although FIG. 2 shows the circuit configuration and the equivalent circuit only for the active inductor 14_1, the active inductor 15_1 also has a similar circuit configuration and equivalent circuit.

The active inductor (also called a gyrator) 14_1 shown in FIG. 2 includes two transconductance (gm) circuits 14_11 and 14_12 and a capacitor 14_13. This active inductor 14_1 is equivalent to an inductor having inductance L given by the equation:

$$L = \frac{C_L}{gm1 \cdot gm2} \tag{3}$$

where gm1 and −gm2 are transconductance of the transconductance circuits 14_11 and 14_12, respectively, and $C_L$ is the capacitance of the capacitor 14_13.

As will be described later, the inductance L of the active inductor 14_1 can be set to an arbitrary value by adjusting the transconductance gm1 and gm2 of the transconductance circuits 14_11 and 14_12, by controlling the external signal, or by adjusting the capacitance $C_L$ of the capacitor 14_13.

The impedance Za of the parallel resonant circuit 14 (and also the parallel resonant circuit 15) used as the load of the mixer 10 is given by the equation:

$$Za = \frac{1}{\frac{1}{R} + \frac{1}{j2fL} + j2\pi c} \tag{4}$$

Figure 3:
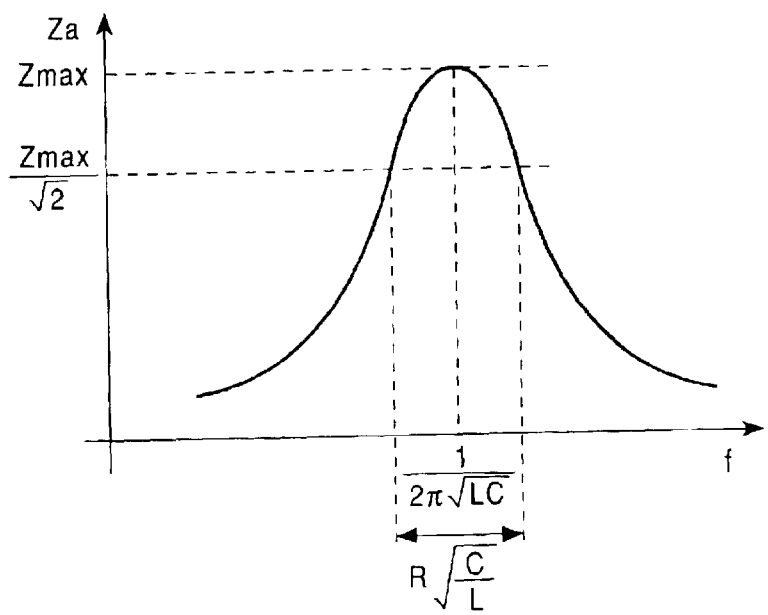
FIG. 3 is a graph showing the impedance-frequency characteristic of a parallel resonant circuit.

FIG. 3 shows the impedance-frequency characteristic of the parallel resonant circuit 14.

In FIG. 3, the horizontal axis indicates the frequency and the vertical axis indicates the impedance. In this parallel resonant circuit 14, the impedance has a maximum value Zmax at a frequency of $\frac{1}{2\pi\sqrt{LC}}$ and has a value of $Zmax/\sqrt{2}$ at a frequency lower by $R/2\sqrt{C/L}$ and also at a frequency higher by $R/2\sqrt{C/L}$ than the frequency at which the impedance has the maximum value Zmax. Such frequency selectivity of the output load of the mixer 10 causes the output signal of the mixer 10 to have frequency selectivity, and thus the mixer 10 has bandpass frequency selectivity.

Figure 4:
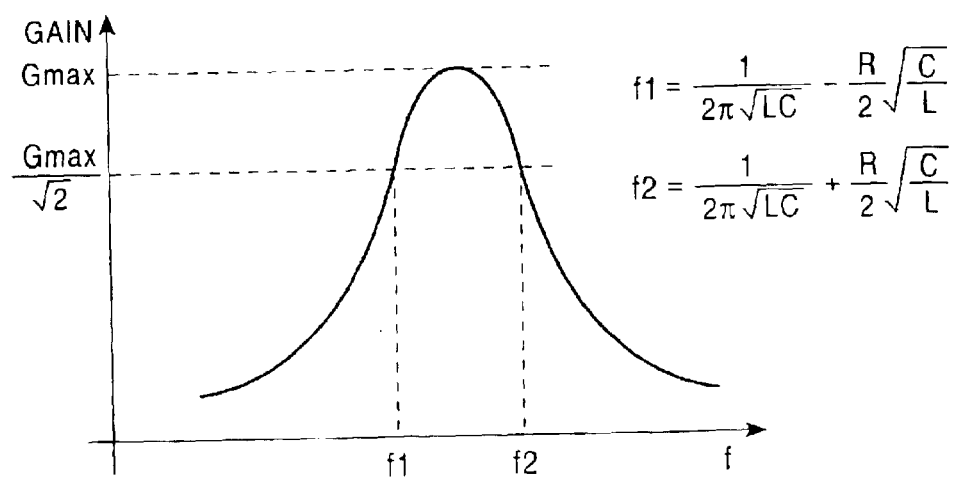
FIG. 4 is a graph showing the characteristic of a bandpass filter of the mixer shown in FIG. 1.

FIG. 4 shows the bandpass frequency characteristic of the mixer shown in FIG. 1.

In FIG. 4, the horizontal axis indicates the frequency and the vertical axis indicates the gain. Herein, the cutoff frequencies f1 and f2 are given by the equations:

$$f1 = \frac{1}{2\pi\sqrt{LC}} - \frac{R}{2} \cdot \sqrt{\frac{C}{L}} \tag{5}$$

$$f2 = \frac{1}{2\pi\sqrt{LC}} + \frac{R}{2} \cdot \sqrt{\frac{C}{L}} \tag{6}$$

In the mixer 10 according to the present embodiment, as will be described later, the transconductance gm of the transconductance circuit of each of the active inductors 14_1 and 15_1 can be arbitrarily adjusted by the external signal thereby arbitrarily varying the inductance L. This makes it possible to vary the cutoff frequencies of the bandpass filter within the ranges given by equations (5) and (6), respectively.

Figure 5:
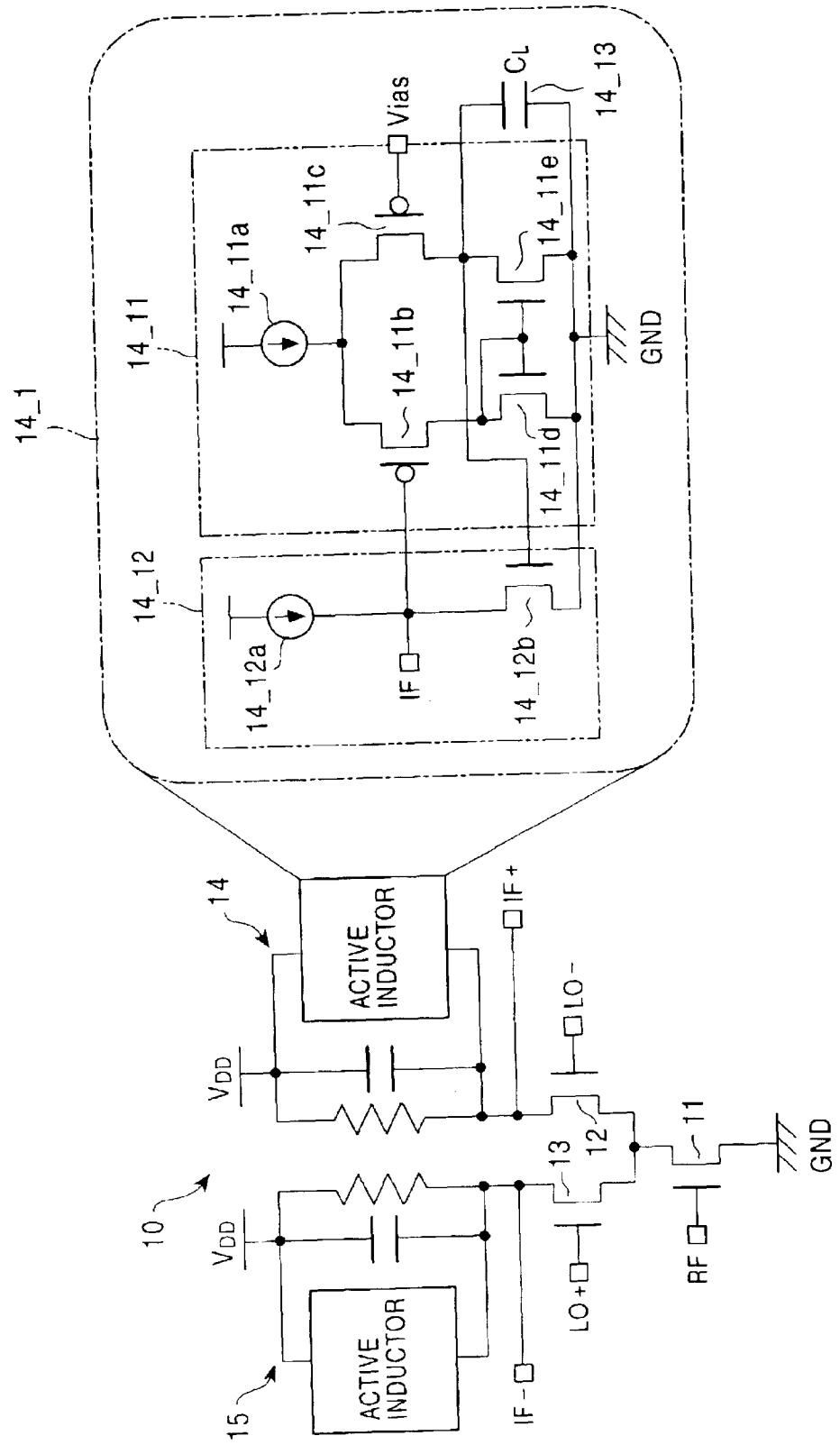
FIG. 5 is a circuit diagram showing a circuit configuration of the active inductor used in the parallel resonant circuit of the mixer shown in FIG. 1.

FIG. 5 shows a circuit configuration of the active inductor used in the parallel resonant circuit of the mixer shown in FIG. 1.

The active inductor 14_1 shown in FIG. 5 includes, as described earlier with reference to FIG. 2, the transconductance circuits 14_11 and 14_12 and the capacitor 14_13. The transconductance circuit 14_11 includes a constant current source 14_11a, PMOS transistors 14_11b and 14_11c, and NMOS transistors 14_11d and 14_11e. A bias voltage Vbias is applied as the external signal from the outside of the chip to the PMOS transistor 14_11c. The transconductance circuit 14_12 includes a constant current source 14_12a, and an NMOS transistor 14_12b. The transconductance gm of the transconductance circuit 14_11 and that of the transconductance circuit 14_12, forming the active inductor 14_1, are equal to the transconductance gm of the PMOS transistor 14_11c and that of the NMOS transistor 14_12b, respectively. Therefore, by controlling the bias current flowing through the respective transconductance circuits 14_11 and 14_12 according to the bias voltage Vbias, the transconductance gm of the PMOS transistor 14_11c and that of the NMOS transistor 14_12b can be controlled arbitrarily. The active inductor 15_1 has a circuit configuration similar to that of the active inductor 14_1. Although in the present embodiment, the bias currents passed through the transconductance circuits 14_11 and 14_12 are controlled by the bias voltage Vbias, the bias currents passed through the transconductance circuits 14_11 and 14_12 may be directly controlled from the outside of the chip.

Figure 11:
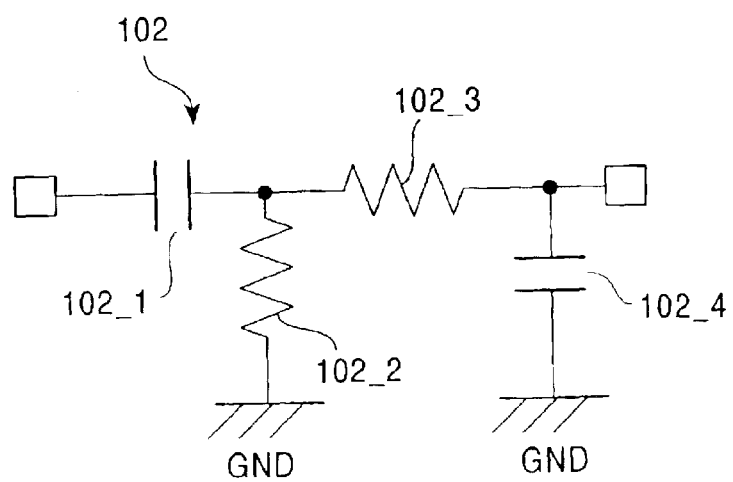
FIG. 11 is a diagram showing the circuit configuration of the bandpass filter shown in FIG. 9.
Figure 12:
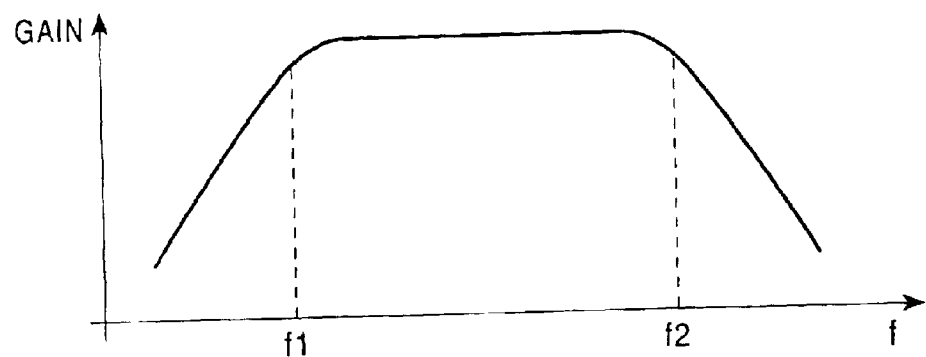
FIG. 12 is a graph showing the frequency characteristic of the bandpass filter shown in FIG. 11.
Figure 13:
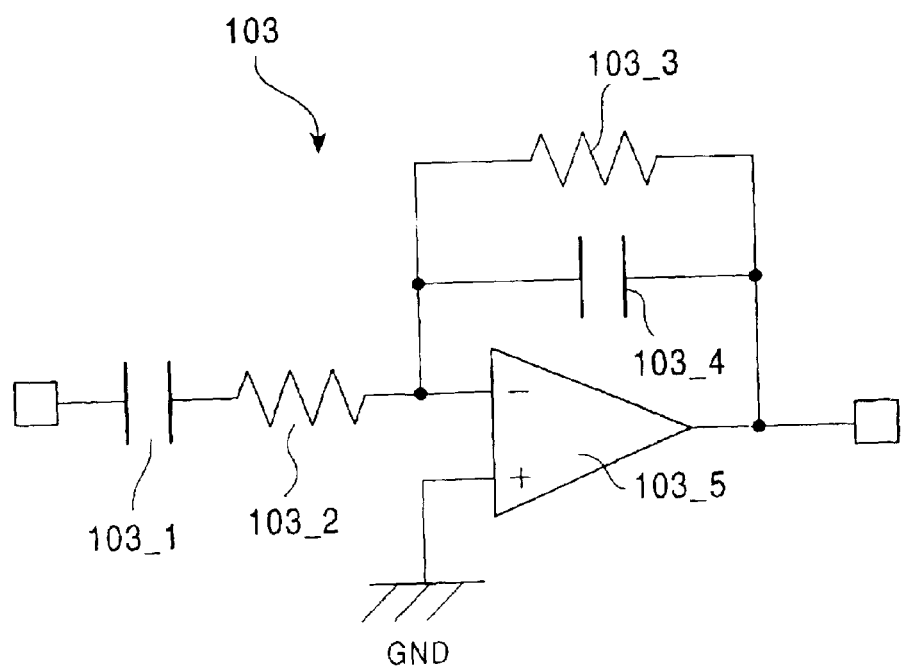
FIG. 13 is a circuit diagram of another bandpass filter having a configuration different from that of the bandpass filter shown in FIG. 11.
Figure 14:
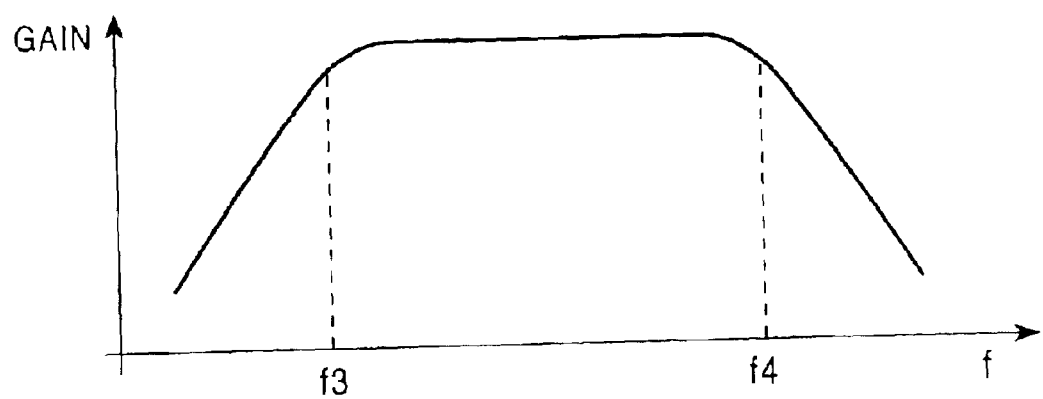
FIG. 14 is a graph showing the frequency characteristic of the bandpass filter shown in FIG. 13.
Figure 15:
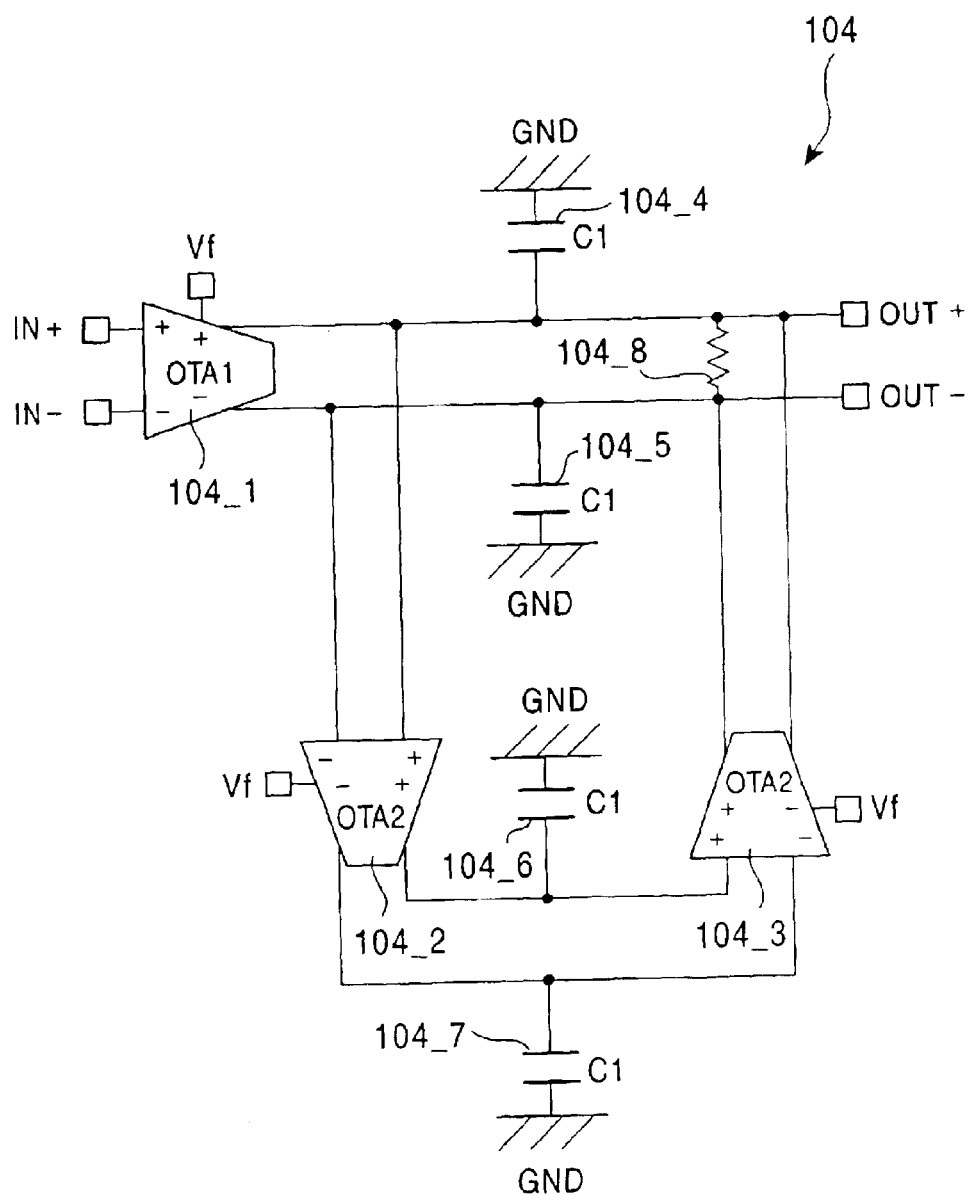
FIG. 15 is a circuit diagram of a biquad bandpass filter.
Figure 16:
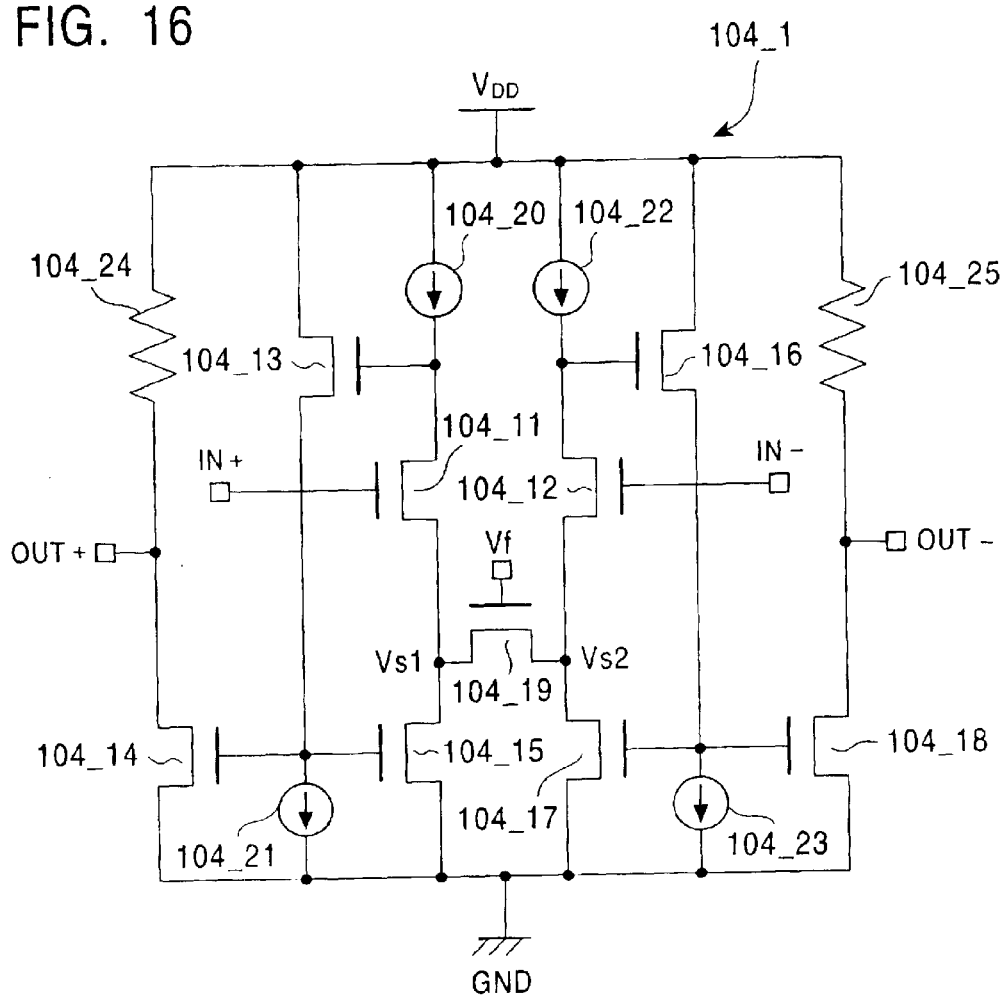
FIG. 16 is a circuit diagram of a transconductor amplifier used in the biquad bandpass filter.
Figure 17:
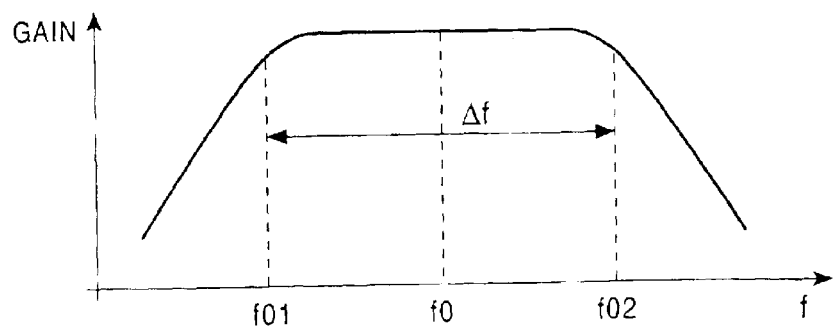
FIG. 17 is a graph showing the frequency characteristic of the biquad bandpass filter shown in FIG. 15.

Use of the active inductors 14_1 and 15_1 allows achievement of high inductance using a small number of transistors, and thus it becomes possible to reduce the chip size compared with the chip sizes required for the bandpass filters shown in FIGS. 11, 13 and 15.

Although in the present embodiment, the invention is applied to a single balanced mixer, the invention may also be applied to other types of mixers, as long as the mixers include a parallel resonant circuit which includes an active inductor and which serves as an output load.

Figure 6:
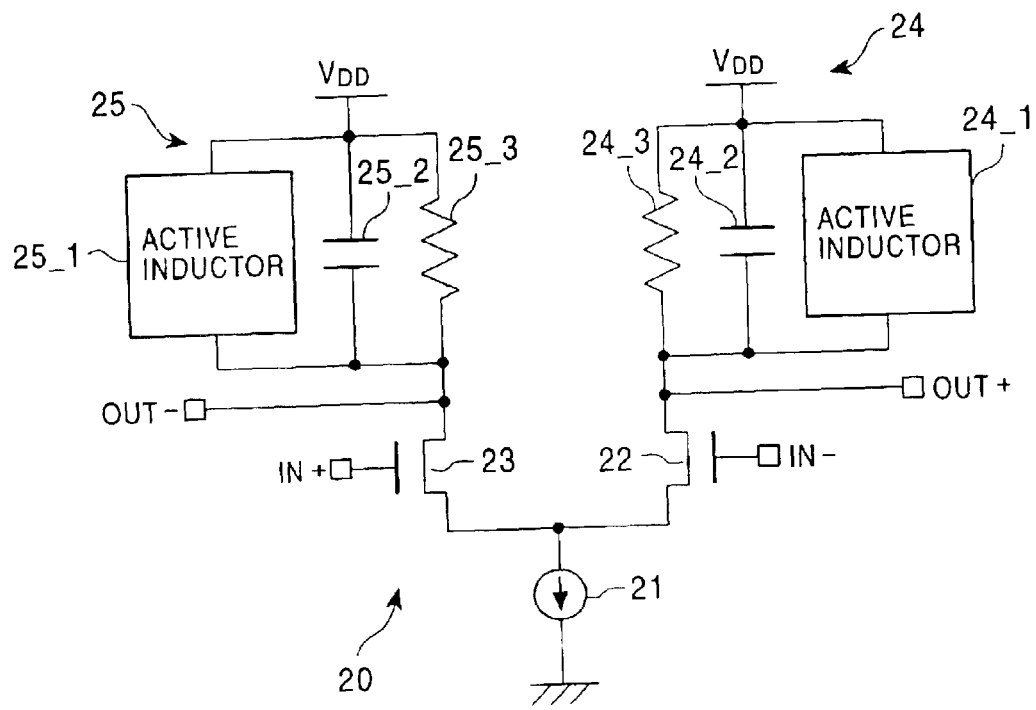
FIG. 6 is a circuit diagram of a differential amplifier according to an embodiment of the present invention.
Figure 7:
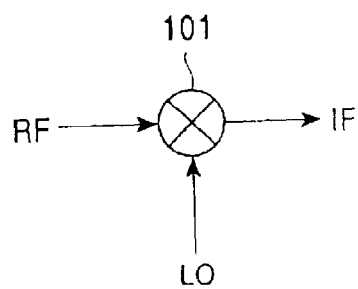
FIG. 7 is a diagram showing a mixer used in an RF receiving circuit.
Figure 8:
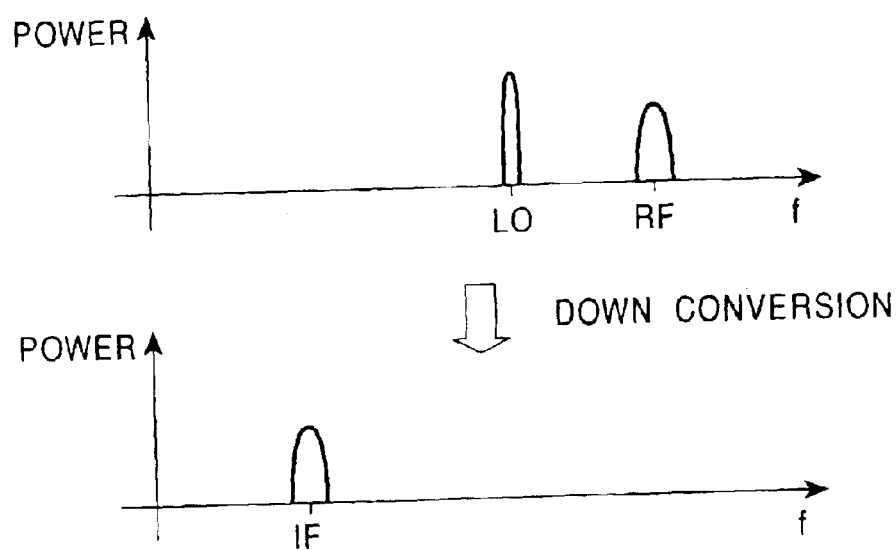
FIG. 8 is a diagram showing a manner in which an RF signal applied to the mixer shown in FIG. 7 is down-converted into an IF signal.
Figure 9:
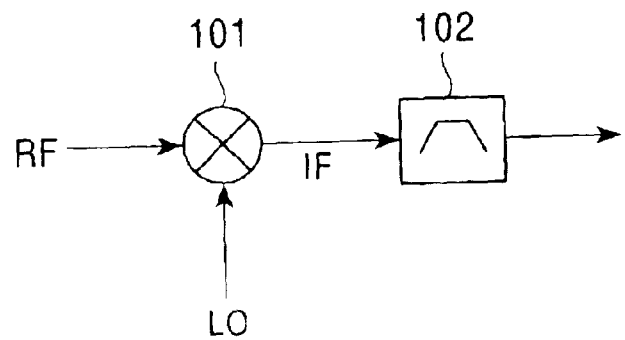
FIG. 9 is a diagram showing a mixer and a bandpass filter.
Figure 10:
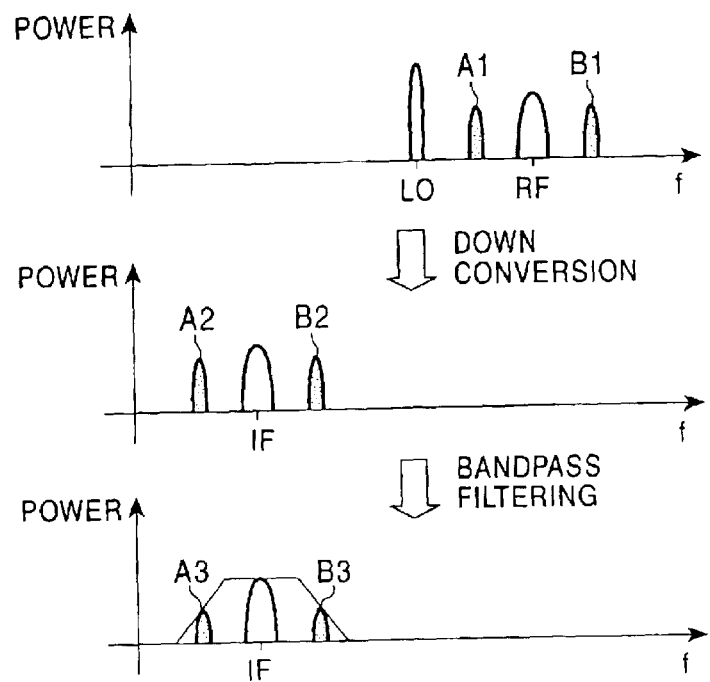
FIG. 10 is a diagram showing a manner in which undesirable signals other than an IF signal are removed by a bandpass filter.

FIG. 6 is a circuit diagram of a differential amplifier according to an embodiment of the present invention.

The differential amplifier 20 shown in FIG. 6 includes a constant current source 21, NMOS transistors 22 and 23 to which signals IN– and IN+, separated in phase by 180° from each other, are applied, a parallel resonant circuit 24 serving as an output load disposed between a power supply $V_{DD}$ and the NMOS transistor 22, and a parallel resonant circuit 25 serving as an output load disposed between the power supply $V_{DD}$ and the NMOS transistor 23.

The parallel resonant circuit 24 includes an active inductor 24_1, a capacitor 24_2, and a resistor 24_3. Similarly, the parallel resonant circuit 25 includes an active inductor 25_1, a capacitor 25_2, and a resistor 25_3. The operations and functions of those parallel resonant circuits 24 and 25 are similar to those of the parallel resonant circuits 14 and 15 described above, and thus a further description thereof is not given herein. Use of the parallel resonant circuits 24 and 25 as the output loads of the differential amplifier 20 causes the differential amplifier 20 to have bandpass frequency selectivity similar to that of the mixer 10 described above.

Furthermore, use of parallel resonant circuits as output loads in the mixer 10 or the differential amplifier 20 according to the present invention makes it possible to control the cutoff frequency of the bandpass frequency selectivity by the external signal. This allows reductions in production costs and the development period. Furthermore, compared with conventional bandpass filters using passive elements, a smaller size of the semiconductor chip can be realized. This allows a reduction in cost for the semiconductor chip.

As described above, the mixer and the differential amplifier according to the present invention has the advantage that the cutoff frequencies can be easily changed and they can be formed to be simple in circuit configuration.

While particular embodiments have been described, alternatives, modifications, variations, improvements and substantial equivalents that are or may be presently unforeseen may arise to Applicant or others skilled in the art. Accordingly, the amended claims as filed and as they may be amended are intended to embrace all such alternatives, modifications, variations, improvements and substantial equivalents.

What is claimed is:

1. A mixer for mixing an AC signal with a reference signal having a particular frequency, comprising:
   a parallel resonant circuit including an active inductor and serving as an output load,
   wherein the AC signal is an RF signal and the reference signal is an output signal of a local oscillator, the frequency of the output signal being separated by a particular value from the frequency of the RF signal.

2. A mixer according to claim 1, wherein the active inductor comprises two transconductance circuits and a capacitor, and the inductance of the active inductor is controlled by the transconductance of the two transconductance circuits and the capacitance of the capacitor.

3. A mixer according to claim 2, wherein the inductance of the active inductor can be arbitrarily varied by controlling the transconductance of the two transconductance circuits in response to an external signal.

4. A mixer for mixing an AC signal with a reference signal having a particular frequency, comprising:
   a parallel resonant circuit including an active inductor and serving as an output load,
   wherein the parallel resonant circuit comprises an active inductor, a capacitor, and a resistor that are connected in parallel.

5. A mixer according to claim 4, wherein the parallel resonant circuit has bandpass frequency selectivity given by the expression:

$$\frac{1}{2\pi\sqrt{LC}} + \frac{R}{2}\cdot\sqrt{\frac{C}{L}} \geq f \geq \frac{1}{2\pi\sqrt{LC}} - \frac{R}{2}\cdot\sqrt{\frac{C}{L}}$$

where L is the inductance of the active inductor, C is the capacitance of the capacitor, R is the resistance of the resistor, and f is the resonant frequency of the parallel circuit.

6. A differential amplifier for amplifying the difference between two input signals and outputting a resultant amplified differential signal, comprising:
   a parallel resonant circuit including an active inductor and serving as an output load,
   wherein the parallel resonant circuit comprises an active inductor, a capacitor, and a resistor that are connected in parallel.

7. A differential amplifier for amplifying the difference between two input signals and outputting resultant amplified differential signal, comprising:
   a parallel resonant circuit including an active inductor and serving as an output load,
   wherein the parallel resonant circuit has bandpass frequency selectively given by the expression:

$$\frac{1}{2\pi\sqrt{LC}} + \frac{R}{2}\cdot\sqrt{\frac{C}{L}} \geq f \geq \frac{1}{2\pi\sqrt{LC}} - \frac{R}{2}\cdot\sqrt{\frac{C}{L}}$$

where L is the inductance of the active inductor, C is the capacitance of the capacitor, R is the resistance of the resistor, and f is the resonant frequency of the parallel resonant circuit.

8. A differential amplifier according to claim 6, wherein the active inductor includes two transconductance circuits and a capacitor, and the inductance of the active inductor is controlled by the transconductance of the two transconductance circuits and the capacitance of the capacitor.

9. A differential amplifier according to claim 8, wherein the inductance of the active inductor can be arbitrarily varied by controlling the transconductance of the two transconductive circits in response to an external signal.

* * * * *